United States Patent [19]

Juri et al.

[11] Patent Number: 5,272,528
[45] Date of Patent: Dec. 21, 1993

[54] INFORMATION RECORDING APPARATUS

[75] Inventors: Tatsuro Juri, Osaka; Masakazu Nishino, Kashiwara; Hideki Ohtaka, Neyagawa, all of Japan

[73] Assignee: Matsushita Electric Industrial Co., Ltd., Osaka, Japan

[21] Appl. No.: 805,520

[22] Filed: Dec. 13, 1991

[30] Foreign Application Priority Data

Dec. 21, 1990 [JP] Japan .................... 2-404863

[51] Int. Cl.$^5$ .............................. H04N 7/133
[52] U.S. Cl. ........................ 358/133; 375/27; 382/56
[58] Field of Search ............. 358/133; 375/27, 382/56

[56] References Cited

U.S. PATENT DOCUMENTS

| | | | |
|---|---|---|---|
| 4,593,267 | 6/1986 | Kuroda | 375/27 |
| 4,774,574 | 9/1988 | Daly et al. | 358/133 |
| 4,805,030 | 2/1989 | Tanaka | 382/56 |
| 4,907,101 | 3/1990 | Keesen et al. | 360/48 |

FOREIGN PATENT DOCUMENTS

| | | |
|---|---|---|
| 0098153 | 1/1984 | European Pat. Off. |
| 0235566 | 9/1987 | European Pat. Off. |
| 3736898 | 5/1989 | Fed. Rep. of Germany |

*Primary Examiner*—Howard W. Britton
*Attorney, Agent, or Firm*—Stevens, Davis, Miller & Mosher

[57] ABSTRACT

An information recording apparatus implements the orthogonal transformation for the input signal on a block-by-block basis, separates each variable-length coded word into a fixed part and separate part individually, records the fixed part into a record block which is established for each block of orthogonal component by starting from the beginning and ending at the prescribed position of the record block, and records coded words of the separate part into remaining portions of record blocks.

6 Claims, 4 Drawing Sheets

FIG. 2

LOW FREQUENCY BAND → HORIZONTAL HIGH FREQUENCY BAND

| 1 | 3 | 4 | 10 | 11 | 21 | 22 | 36 |
|---|---|---|----|----|----|----|----|
| 2 | 5 | 9 | 12 | 20 | 23 | 35 | 37 |
| 6 | 8 | 13 | 19 | 24 | 34 | 38 | 49 |
| 7 | 14 | 18 | 25 | 33 | 39 | 48 | 50 |
| 15 | 17 | 26 | 32 | 40 | 47 | 51 | 58 |
| 16 | 27 | 31 | 41 | 46 | 52 | 57 | 59 |
| 28 | 30 | 42 | 45 | 53 | 56 | 60 | 63 |
| 29 | 43 | 44 | 54 | 55 | 61 | 62 | 64 |

VERTICAL HIGH FREQUENCY BAND

FIG. 3A
VARIABLE-LENGTH ENCODED OUTPUT
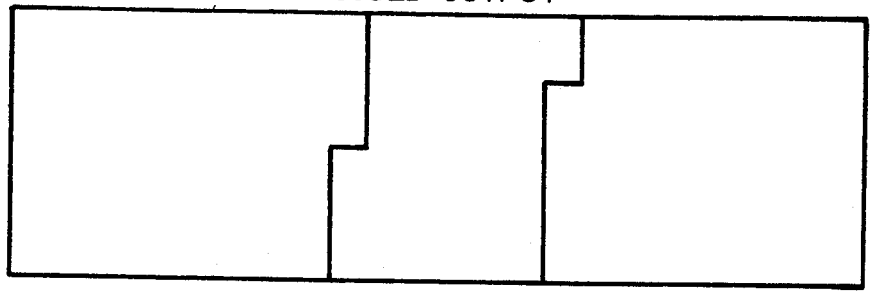
FIG. 3B
FIXED PART
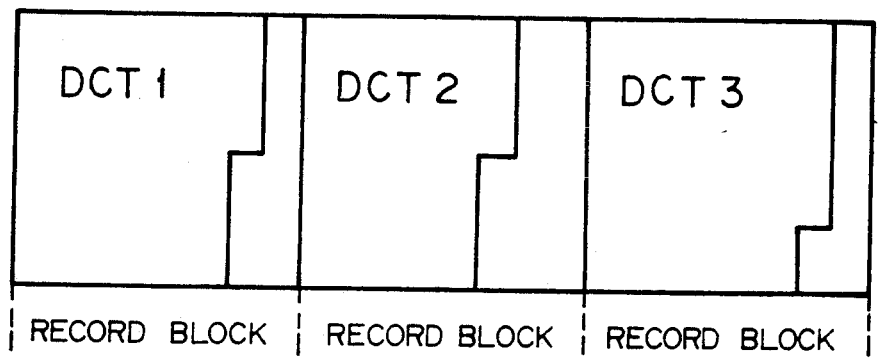
SEPARATE PART
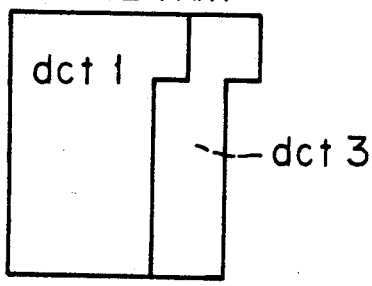
FIG. 3C
MEMORY OUTPUT
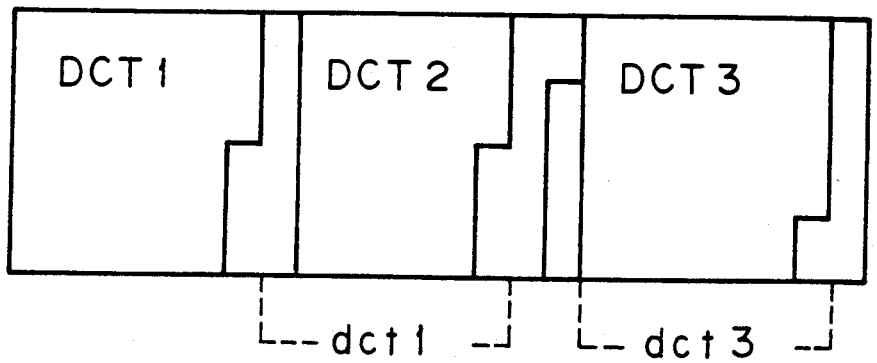

FIG. 4A
VARIABLE-LENGTH ENCODED OUTPUT
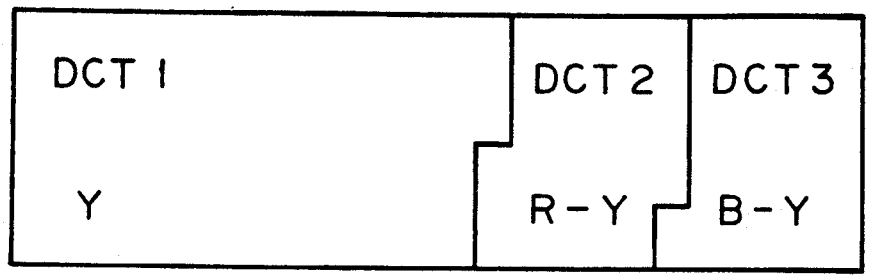
FIG. 4B
FIXED PART
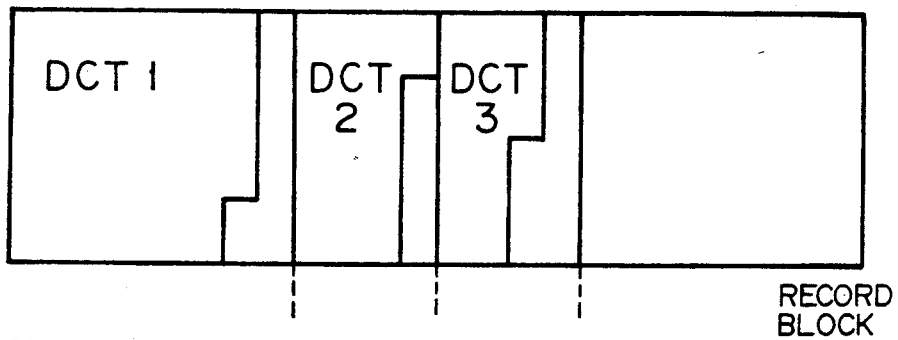
SEPARATE PART
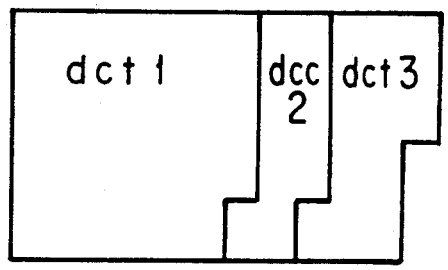
FIG. 4C
MEMORY OUTPUT
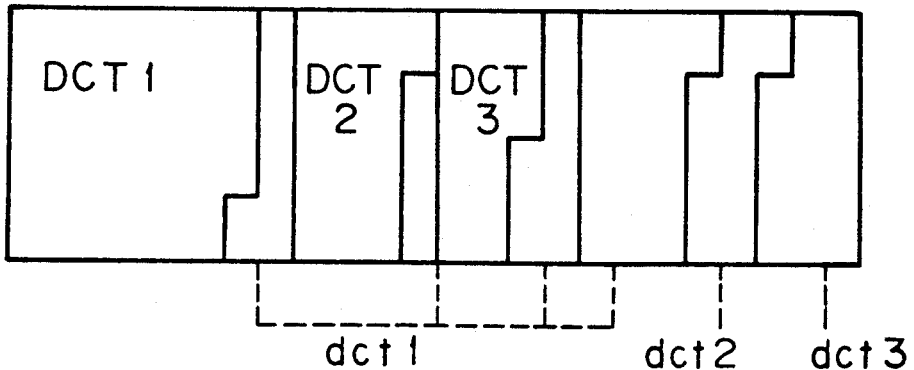

INFORMATION RECORDING APPARATUS

BACKGROUND OF THE INVENTION

1. Field of the Invention

This invention relates to an information recording apparatus which records video information or audio information through the rendition of variable-length encoding.

2. Description of the Prior Art

Video information is a huge amount of data, and therefore when it is transmitted or recorded, it is often rendered high-efficiency encoding in order to reduce the quantity of data. The high-efficiency encoding is a means of compressing the quantity of data by eliminating redundant components possessed by video information. A specific scheme of high-efficiency encoding is to divide input sampled values into blocks of adjoining pixels and encode individual blocks through the orthogonal transformation. Orthogonal components are rendered quantization and variable-length encoding for transmission.

The variable-length encoding is to encode a signal with a lower occurrence probability into a coded word of a large number of bits and encode a signal with a higher occurrence probability into a coded word of a less number of bits, thereby transmitting data in a less number of bits as the whole. Conventional transmission and recording apparatus dealing with video or audio data are based on the variable-length encoding scheme, such as that mentioned above, for the reduction of data in carrying out their inherent roles.

However, with variable-length encoding being used, even a single-bit error incurs disorder of synchronous encoding, disabling the variable-length coded signal from subsequent decoding. On this account, the conventional apparatus are very vulnerable to errors of transmission path, and they need many error correction codes and reset signals for the protection of data.

The present invention is intended to overcome the foregoing deficiency of the conventional recording and playback apparatus.

SUMMARY OF THE INVENTION

This invention resides in a recording apparatus comprising a small block formation means which forms video or audio information into small blocks each consisting of multiple pixels, an orthogonal transform means which transforms each small block of information into orthogonal components, a rearrangement means which rearranges the orthogonal components, a variable-length encoding means which quantizes and encodes the orthogonal components thereby to produce a variable-length coded word, a variable-length coded word separation means which, in recording the variable-length coded word of each small block into a fixed-length record block that is determined for each small block, writes the variable-length coded word of the small block into the record block by starting from the front section thereof, and, if the remaining number of bits of the record block is smaller than the maximum code length of variable-length encoding, separates the variable-length coded word instead of writing the whole word to the record block, and a space portion recording means which writes separated portions of variable-length coded words of multiple small blocks into space portions which are left unfulled when data of small blocks have been written by the variable-length coded word separation means or into a space portion which is left unfilled after all variable-length coded words of small blocks have been written into record blocks.

BRIEF DESCRIPTION OF THE DRAWINGS

FIG. 2 is a diagram showing the rearrangement process based on this invention;

FIGS. 3A through 3C are first distribution diagrams of variable-length coded words based on this invention; and FIGS. 4A through 4C are second distribution diagrams of variable-length coded words based on this invention.

DESCRIPTION OF THE PREFERRED EMBODIMENTS

Figure 1:
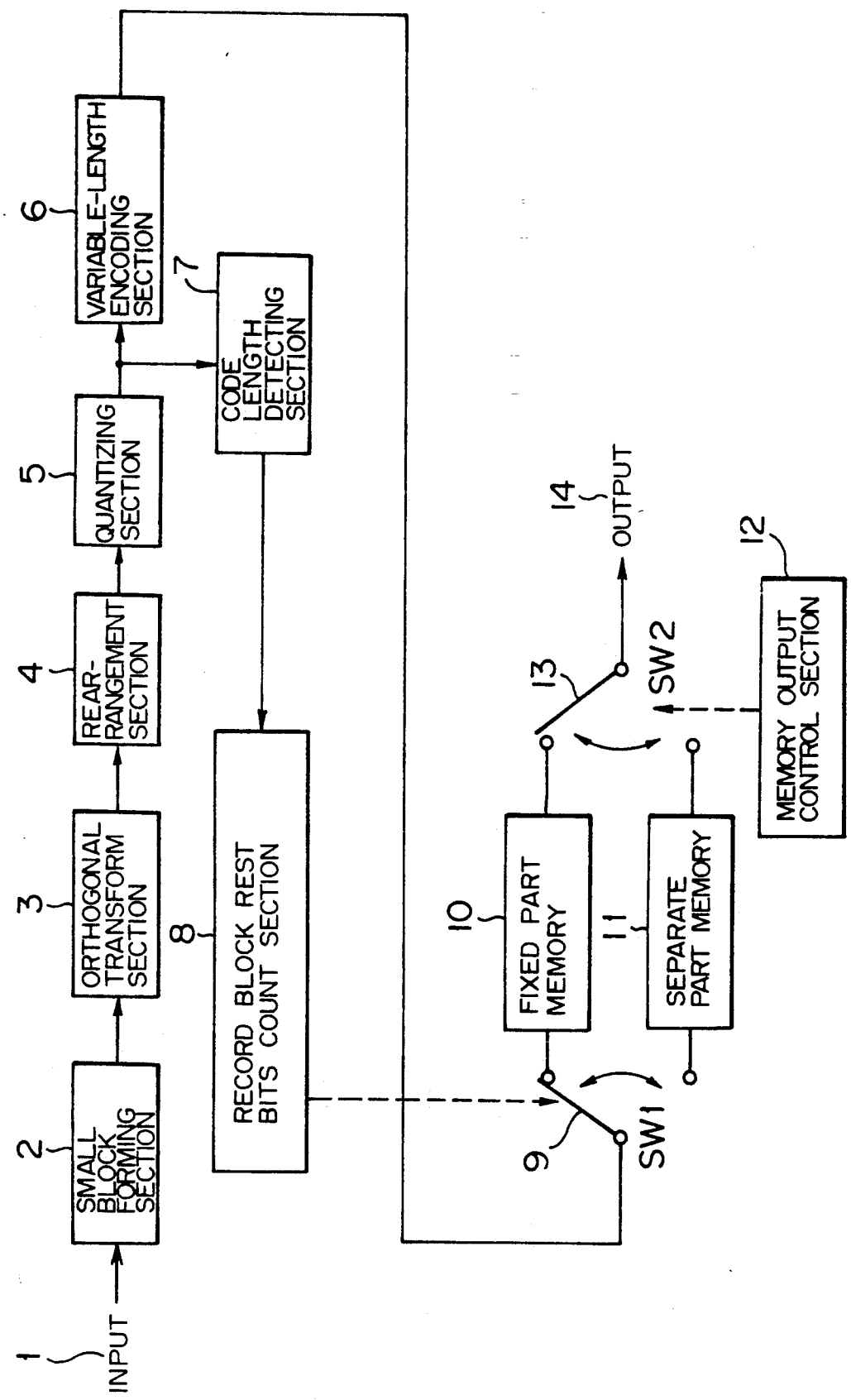
FIG. 1 is a block diagram of an embodiment of this invention.

The present invention will be described for its specific embodiments. FIG. 1 is a block diagram of the recording apparatus based on this invention. In the figure, indicated by 1 is an input section, 2 is a small block forming section, 3 is an orthogonal transform section, 4 is a rearrangement section, 5 is a quantizing section, 6 is a variable-length encoding section, 7 is a code length detecting section, 8 is a record block rest bits count section, 9 is a switch (SW1), 10 is a fixed part memory, 11 is a separate part memory, 12 is a memory output control section, 13 is a switch (SW2), and 14 is an output section.

Next, the operation of this embodiment will be explained. An input signal entered through the input section 1 is formed into small blocks suitable in size for orthogonal transformation by the small block forming section 2. Each small block of signal is rendered orthogonal transformation by the orthogonal transform section 3, and then the result is rearranged by the rearrangement section 4. This embodiment employs discrete cosine transform (DCT) for orthogonal transformation.

FIG. 2 is a diagram explaining the rearrangement process based on this invention. An input signal is formed into a 2-dimensional block of 64 pixels including eight pixels horizontally and eight pixels vertically. Shown in FIG. 2 is the result of 2-dimensional orthogonal transformation for the 2-dimensional block arranged in the ascending order of frequency components. The top left corner is for the orthogonal component of the lowest frequency in the horizontal and vertical directions, a more rightward position is for an orthogonal component representing a higher horizontal frequency, and a more leftward position is for an orthogonal component representing a lower frequency. Numerals shown in FIG. 2 represent the sequence of output of the orthogonal components arranged as described above. Accordingly, the rearrangement section delivers the orthogonal transform components in the ascending order of frequency components in both horizontal and vertical directions.

The orthogonal components rearranged by the rearrangement section 4 are quantized by the quantizing section 5. The quantizing process is to round the value of orthogonal component for controlling the quantity of data after encoding. The quantized orthogonal component is encoded in variable length by the variable-length encoding section 6, and the code length of the coded word is detected by the code length detecting section 7.

Each small block (will be termed DCT block) has the assignment of a fixed-length record block, and the variable-length coded word is recorded in the form of a record block. The code length detected by the code length detecting section 7 is indicated to the record block rest bits count section 8, which calculates the number of remaining bits of the record block for the DCT block which is currently under variable-length encoding based on the detected code length. In case the number of remaining bits is equal to or greater than the maximum code length of variable-length encoding, the coded word is conducted by the switch (SW1) 9 and written into the fixed part memory 10. In case the number of remaining bits is smaller than the maximum code length, the coded word is conducted by the switch (SW1) 9 and written into the separate part memory 11.

After coded words of a prescribed number of DCT blocks have been separated into a fixed part and a separate part, the memory output control section 12 operates on the switch (SW2) 13 to select the output of the fixed part memory 10 or separate part memory 11 so that the outputs of the separate part memory are filled in the remaining portions of coded words which have been recorded in the fixed part memory of the recorded blocks, and the result is delivered to the output section 14.

FIGS. 3A-3C are diagrams explaining the control of the fixed part memory 10 and separate part memory 11 in dealing with three DCT blocks as an example. Shown in FIG. 3A are coded words of three blocks in variable lengths filled intact into a block. Shown in FIG. 3B are the contents of the fixed part memory 10 and separate part memory 11 based on this invention. The fixed part memory records coded words until the number of remaining bits of a record block (shown as a rectangle having an area which is a one-third area of the whole rectangle of FIG. 3A) is smaller than the maximum code length of variable-length encoding, and the separate part memory 11 records the excessive portions. In this example, parts of the coded words DCT1 and DCT3 are written into the separate part memory 11 (shown by dct1 and dct3). These two mamories are read out such that coded words from the separate part memory are inserted into remaining portions of record blocks which are left unfilled after coded words from the fixed part memory have been written, as shown in FIG. 3C.

In this manner, by separating a coded word of DCT block into a fixed part and a separate part, even in the emergence of error of transmission path, the error in the fixed part is not propagated to other blocks. Accordingly, by recording coded words into the fixed part in the ascending order of frequency shown in FIG. 2, it becomes possible to collect propagated errors of transmission path in high-frequency components that are recorded as a separate part. Generally, distortions of high frequency components are less noticeable in terms of the vision, and the influence of propagated errors can be alleviated based on this invention.

In case the number of remaining bits of a record block is smaller than the maximum code length of variable-length encoding, the remaining portions of the coded word are recorded in the separate part. Accordingly, the fixed part and separate part are always in pairs for a coded word, instead of being separated among coded words. Consequently, it is possible to have variable-length decoding independently for the fixed part and separate part, and this facilitates the decoding process.

Next, the second embodiment of this invention will be explained. This embodiment is the same in block diagram as the first embodiment shown in FIG. 1, and is similar in operation to the first embodiment, with differences being the variable-length encoding process and the structure of record block.

First, variable-length encoding based on this embodiment will be explained. This process is implemented such that a specific bit pattern (sync pattern) occurs only in the end section of a coded word or an arbitrary number of coded words in linkage. Examples of such coded words will be explained with reference to the following Table 1. In the encoding process, for a quantized value of 0, the number of following 0's quantized values and a subsequent quantized value are combined to form a coded word. Through the encoding in terms of a set of the length of a 0's string and the subsequent quantized value, quantized orthogonal component values with a high probability of occurrence of 0 can be encoded efficiently. In the column of input data expressed by 2-dimensional vectors in Table 1, the left-hand numeral represents the number of consecutive 0's and the right-hand numeral represents the subsequent quantized value. EOB is a coded word indicating that the rest of the DCT block is an all 0's string.

TABLE 1

| Input | Coded word |
| --- | --- |
| (0, 1) | 0 |
| (1, 1) | 1 0 0 |
| (0, 2) | 1 1 0 |
| (1, 2) | 1 1 1 0 0 |
| (2, 1) | 1 1 1 0 1 |
| EOB | 1 1 1 1 0 0 |
| (0, 3) | 1 1 1 1 0 1 |
| . | . |
| . | . |
| . | . |

A feature of variable-length encoding shown in Table 1 is that bit pattern (sync pattern) "00" occurs only in the end section of a coded word or an arbitrary number of coded words in linkage. On this account, even in the event of sync disorder of variable-length coded words due to error of transmission path or the like, the end of a coded word can be detected through the detection of the sync pattern, whereby word synchronization can be restored. The separation means separates the fixed part and separate part always for each coded word, instead of separating them among coded words, as mentioned in the first embodiment. Consequently, restoration of word synchronization based on the sync pattern can be done independently for the fixed part and separate part. Restoration of word synchronization is followed by restoration of DCT block synchronization by detecting the EOB. By decoding up to the last DCT block, the DCT block which has been restored initially can be determined by counting the number of blocks back from the last DCT block. According to this embodiment, in the event of error of transmission path, propagation of error can be minimized for both of the fixed part and separate part.

FIGS. 4A-4C are diagrams explaining the distribution of the fixed part and separate part based on this embodiment. The record block has its size varied depending on the type of input DCT block. Shown in these figures are a block DCT1 for the luminance signal (Y), a block DCT2 for the color difference signal (R-Y), and a block DCT3 for the color difference signal (B-Y).

Because of a small amount of data of the encoded color difference signal relative to the luminance signal in general, a larger record block is assigned to DCT1 and smaller record blocks are assigned to DCT2 and DCT3 flexibly, as shown in FIG. 4B. In this figure, a record block which is not assigned to any DCT block is reserved as the fourth record block. Reservation of such record block in the latter portion enables the reproduction of the quantized value of low-frequency components of a DCT block even if data of the latter portion is subjected to a transmission path error or the like.

Although the present invention has been described for its two specific embodiments, various arrangements are still possible besides the foregoing. Although the foregoing embodiments are the case where three DCT blocks in combination fill a certain amount of data, the number of blocks is arbitrary, and the invention is also applicable to the case where the amount of data can vary within a certain range. The present invention is applicable to transmission apparatus besides recording apparatus.

According to this invention, in which a fixed-length record block is assigned to each small block as described above, even in the occurrence of error, it affects only the immediate block and a coded word(s) which is separated by the variable-length coded word separation means. Accordingly, by writing coded words into record blocks in the order of the significance of component, the influence of error can be extremely minimized. In case the number of remaining bits of a record block is smaller than the maximum code length of variable-length encoding, the latter portion of the coded word is separated and recorded in a subsequent remaining portion(s) of record block(s). Separation of coded word takes place for each coded word (a coded word is not divided), and decoding of variable-length codes is facilitated.

The inventive variable-length encoding process is such that a specific bit pattern (sync pattern) occurs only at the end of a coded word or an arbitrary number of coded words in linkage. Consequently, even in the event of sync disorder of variable-length codes due to error of transmission path, the word synchronization can be restored by detecting the end of a coded word through the detection of the sync pattern. After the restoration of word synchronization, subsequent variable-length coded words are decoded and the quantized values, end-of-DCT-block signals, and the number of DCT blocks are detected, thereby reproducing the quantized values of the original DCT blocks. Consequently, data of DCT blocks other than the DCT block having a transmission path error can be reproduced, and the influence of the error can be minimized.

We claim:
1. A recording apparatus comprising: small block formation means for forming video or audio information into small blocks each consisting of multiple pixels; orthogonal transform means for transforming each small block of information provided by said small block formation means into orthogonal components; rearrangement means for rearranging the orthogonal components provided by said orthogonal transform means; variable-length quantizing and encoding means for quantizing and encoding the orthogonal components provided by said orthogonal transform means thereby to produce a variable-length coded word; variable-length coded word separation means which, in recording the variable-length coded word of each small block into a fixed-length record block that is determined for each small block, writes the variable-length coded word of the small block into the record block by starting from a front section thereof, and, if the variable-length coded word has been written up to a prescribed position of the record block, separates the coded word instead of writing the whole word into the record block; and space portion recording means for writing separated portions of variable-length coded words of multiple small blocks into space portions, which are left unfilled when data of small blocks have been written by said variable-length coded word separation means or into a space portion which is left unfilled after all variable-length coded words have been written into record blocks of small blocks.

2. A recording apparatus according to claim 1, wherein said prescribed position of record block is a position at which a number of remaining bits of the record block becomes smaller than a maximum code length made by said variable-length encoding means.

3. A recording apparatus according to claim 1, wherein said variable-length encoding means implements encoding to form coded words such that a specific bit pattern (sync pattern) occurs only at an end section of a coded word or an intended number of coded words in linkage.

4. A recording apparatus according to claim 1, wherein said variable-length encoding means implements encoding for a set of a number of consecutive 0's values of orthogonal component and a value of orthogonal component which appears subsequently.

5. A recording apparatus according to claim 1, wherein said rearrangement means rearranges orthogonal components in an order of significance in terms of vision.

6. A recording apparatus according to claim 1, wherein record blocks have different sizes depending on the type of signals formed into small blocks.

* * * * *